United States Patent
Ryu et al.

(10) Patent No.: US 7,964,945 B2
(45) Date of Patent: Jun. 21, 2011

(54) GLASS CAP MOLDING PACKAGE, MANUFACTURING METHOD THEREOF AND CAMERA MODULE

(75) Inventors: Jin Mun Ryu, Hwaseong-Si (KR); Jung Seok Lee, Suwon-Si (KR); Hyung Kyu Park, Suwon-Si (KR); Bo Kyoung Kim, Suwon-Si (KR); Yun Seok Woo, Gunpo-Si (KR); Jung Jin Kim, Hwaseong-Si (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 51 days.

(21) Appl. No.: 12/194,988

(22) Filed: Aug. 20, 2008

(65) Prior Publication Data
US 2009/0085138 A1    Apr. 2, 2009

(30) Foreign Application Priority Data

Sep. 28, 2007 (KR) .................. 10-2007-0097814
May 15, 2008 (KR) .................. 10-2008-0044989

(51) Int. Cl.
*H01L 23/02* (2006.01)
(52) U.S. Cl. ............... 257/680; 257/681; 257/E21.124; 257/E23.192
(58) Field of Classification Search .......... 257/680, 257/681, E23.124, E23.192
See application file for complete search history.

(56) References Cited

U.S. PATENT DOCUMENTS

| | | | |
|---|---|---|---|
| 5,072,284 A * | 12/1991 | Tamura et al. | 257/680 |
| 6,455,927 B1 * | 9/2002 | Glenn et al. | 257/686 |
| 6,624,921 B1 * | 9/2003 | Glenn et al. | 359/291 |
| 7,482,682 B2 * | 1/2009 | Chen et al. | 257/680 |
| 7,719,097 B2 * | 5/2010 | Watanabe | 257/680 |
| 2006/0043555 A1 * | 3/2006 | Liu | 257/680 |
| 2007/0120041 A1 * | 5/2007 | Shiv et al. | 250/200 |
| 2007/0210399 A1 * | 9/2007 | Lee et al. | 257/434 |
| 2008/0191333 A1 * | 8/2008 | Yang et al. | 257/680 |
| 2008/0191335 A1 * | 8/2008 | Yang et al. | 257/680 |

FOREIGN PATENT DOCUMENTS

| | | |
|---|---|---|
| JP | 09-055487 A | 2/1997 |
| KR | 1020020087769 A | 11/2002 |
| KR | 20-0349452 Y1 | 4/2004 |
| KR | 1020070025442 A | 8/2007 |

OTHER PUBLICATIONS

Notice of Allowance issued Aug. 31, 1999 by the Korean Patent Office.

* cited by examiner

Primary Examiner — Ngan Ngo
(74) Attorney, Agent, or Firm — Lowe, Hauptman, Ham & Berner, LLP

(57) ABSTRACT

A glass cap molding package includes a substrate with an external connection terminal formed on a peripheral region of a top surface; an image sensor mounted on the top surface of the substrate; a transparent member installed on an upper part of the image sensor; and a molding unit formed to seal the image sensor and the transparent member. The mold unit exposes the external connection terminal of the substrate to a lateral surface of the substrate. The glass cap molding package and a manufacturing method thereof and a camera module including the same reduce a manufacturing cost and improve productivity by manufacturing a small module in comparison with a conventional module and simplifying a process.

3 Claims, 6 Drawing Sheets

[FIG. 1]

- Prior Art

GLASS CAP MOLDING PACKAGE, MANUFACTURING METHOD THEREOF AND CAMERA MODULE

CROSS-REFERENCE TO RELATED APPLICATIONS

This application claims the benefit of Korean Patent Application Nos. 10-2007-0097814 and 10-2008-0044989 filed with the Korea Intellectual Property Office on Sep. 28, 2007 and May 15, 2008, the disclosures of which are incorporated herein by reference.

BACKGROUND OF THE INVENTION

1. Field of the Invention

The present invention relates to a glass cap molding package and a camera module including the same; and, more particularly, to a glass cap molding package capable of reducing a manufacturing cost and improving productivity by manufacturing a small module in comparison with a conventional module and simplifying a process, a manufacturing method thereof and a camera module.

2. Description of the Related Art

Nowadays, one of primary trends in the semiconductor business is preferably to downsize a semiconductor device. The need for downsizing is particularly remarkable in the semiconductor chip package business, wherein the package means a type sealing an IC (Integrated Circuit) chip on which a fine circuit is designed with plastic resin or ceramic to use the IC chip practically mounted on electronic equipment.

A conventional typical package has a very large size in comparison with the IC chip included therein. Therefore, it is one matter of concern of package engineers to reduce the package size to a chip size level.

Further, a camera module adopting the semiconductor chip package has been used for the electronic equipment such as a cellular phone, an MP3, an automobile and an endoscope.

Several type camera modules have been developed according to components, package methods, or the like and a development trend of the camera module is to provide the high resolution, multi-function, miniaturization, slimness and low-cost camera module.

Hereinafter, a glass cap molding package of semiconductor chip packages applied in a camera module in accordance with a prior art will be described in detail with reference to the accompanying drawing.

Figure 1:
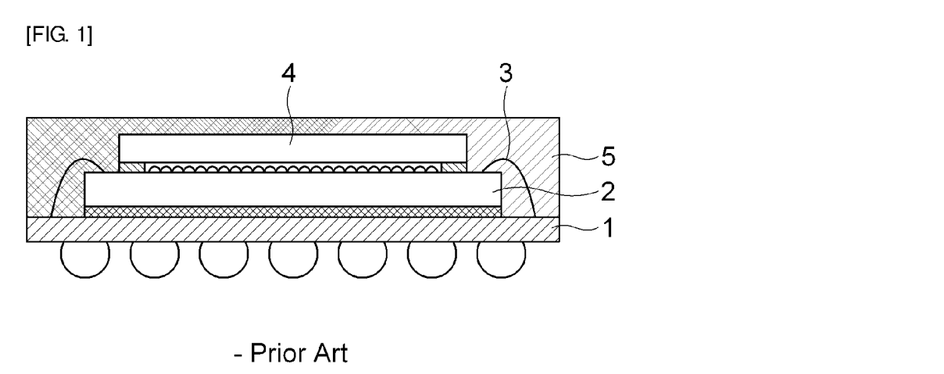
FIG. 1 is a schematic cross-sectional view showing a glass cap molding package in accordance with a prior art.

FIG. 1 is a schematic view showing the glass cap molding package in accordance with the prior art.

As shown in FIG. 1, in accordance with the prior art, the glass cap molding package includes a substrate 1 on which an image sensor 2 is mounted by being electrically connected through a wire 3, a transparent member 4 installed on a top surface of the image sensor 2 to protect a light receiving region of the image sensor 2 and transparent resin 5 formed to seal the image sensor 2 and the transparent member 4.

However, when the glass cap molding package in accordance with the prior art is applied to a camera module having an auto-focusing function, a size of the camera module is increased and it is difficult to apply the glass cap molding package to a side connection type socket.

Particularly, in order to perform the auto-focusing function, the camera module having the auto-focusing function should perform electric signal transmission by electrically connecting a driving device such as an actuator(not shown) for driving a lens barrel mounting a lens upward and downward to the substrate 1 of the glass cap molding package.

Herein, the electric connection between the actuator and the substrate 1 of the glass cap molding package may be performed through an actuator substrate (not shown) connected to the actuator.

That is, it is needed to connect the actuator to the glass cap molding package by forming a connection terminal on the substrate 1 of the glass cap molding package, forming a contact terminal corresponding to the connection terminal on the actuator substrate, and then electrically connecting the connection terminal and the contact terminal by a method such as soldering.

At this time, the connection terminal and the contact terminal need two terminals in case of a VCA (Voice Comb Actuator) or more than 6 terminals in case of a Piezo actuator.

However, because an entire top surface of the substrate 1 of the conventional glass cap molding package is molded with the transparent resin 5, after forming the connection terminal on the top surface of the substrate 1 with increasing the substrate 1 in size or forming the connection terminal on a lateral surface of the substrate 1, the actuator substrate must be extended over the periphery of the glass cap molding package in a horizontal direction and the contact terminal formed on a lower end of the extended region is connected to the connection terminal, whereby the camera module increases in size.

Further, it is difficult to form a pad on the lateral surface of the substrate 1 of the glass cap molding package due to a region and a space where the contact terminal of the actuator substrate is connected to the connection terminal formed on the substrate 1 of the glass cap molding package and therefore it is not possible to apply a side type socket.

SUMMARY OF THE INVENTION

The present invention has been invented in order to overcome the above-described problems and it is, therefore, an object of the present invention to provide a glass cap molding package capable of reducing a manufacturing cost and improving productivity by manufacturing a small module in comparison with a conventional module and simplifying a process, a manufacturing method thereof and a camera module.

In accordance with an aspect of the present invention, there is provided a glass cap molding package including a substrate with an external connection terminal formed on a peripheral region of a top surface; an image sensor mounted on the top surface of the substrate; a transparent member installed on an upper part of the image sensor; and a molding unit formed to seal the image sensor and the transparent member and exposing the external connection terminal of the substrate to a lateral surface of the substrate.

The external connection terminal may be made of conductive material formed on an electrode pad formed on the top surface of the substrate.

At this time, the external connection terminal may be composed of a solder terminal made of solder paste.

Further, the external connection terminal may be composed of a post terminal made of conductive adhesive.

Further, the external connection terminal may be composed of a conductive via.

At this time, the conductive via may be composed of a via hole and a lateral terminal formed by plating the via hole.

The image sensor may be electrically connected to the substrate by a wire bonding method.

The transparent member is preferably installed on a region corresponding to a light receiving part of the image sensor.

At this time, the transparent member may be installed through bonding spacers.

The external connection terminal may be formed by dicing the molding unit and the substrate at once.

Meanwhile, in accordance with another aspect of the present invention, there is provided a glass cap molding package including a substrate with an electrode pad formed on a peripheral region of a top surface and a metal spring soldered to the electrode pad; an image sensor mounted on the top surface of the substrate; a transparent member installed on an upper part of the image sensor; and a molding unit formed to seal the image sensor and the transparent member and exposing the metal spring installed on the substrate to the outside.

Further, in accordance with still another aspect of the present invention, there is provided a glass cap molding package including a substrate with an external connection terminal formed on a peripheral region of a top surface; an image sensor mounted on the top surface of the substrate; a transparent member installed on an upper part of the image sensor; and a molding unit formed to seal the image sensor and the transparent member and having a step unit to expose the external connection terminal of the substrate.

The step unit of the molding unit is preferably formed to expose an upper end of the external connection terminal.

At this time, the step unit of the molding unit may be formed by dicing the molding unit.

A lateral pad may be formed on a lateral surface of the substrate to be connected to an external device such as a socket in a side type.

Meanwhile, in accordance with still another aspect of the present invention, there is provided a manufacturing method of a glass cap molding package including the steps of: preparing an image sensor with transparent members; forming external connection terminals on peripheral regions of a top surface of a substrate; mounting the image sensor on a top surface of the substrate; forming a molding unit to seal the image sensor, the transparent members and the external connection terminals; and exposing the external connection terminal to a lateral surface of the substrate by dicing the molding unit and the substrate.

The step of preparing the image sensor may include the steps of: installing the transparent members on the wafer level image sensor respectively; and dividing the wafer level image sensor into a plurality of unit image sensors by dicing the wafer level image sensor.

The transparent member may be installed by being bonded to a top surface of the image sensor through bonding spacers.

The step of forming the external connection terminal may include the steps of: printing solder paste on the peripheral region of the top surface of the substrate; and forming a solder terminal by curing the solder paste through a reflow process.

And, the step of forming the external connection terminal may include the steps of: forming conductive adhesive on a side of the peripheral region of the top surface of the substrate; and forming a post terminal by curing the conductive adhesive through a reflow process.

Further, the step of forming the external connection terminal may include the steps of: forming a via hole communicated with an electrode pad on the peripheral region of the top surface of the substrate; and forming a lateral terminal by plating the via hole.

The molding unit may be made of epoxy based resin material.

The image sensor may be mounted on a top surface of the substrate by a wire bonding method.

Meanwhile, in accordance with still another aspect of the present invention, there is provided a manufacturing method of a glass cap molding package including the steps of: forming an external connection terminal on a peripheral region of a top surface of a substrate; mounting an image sensor on a top surface of the substrate; installing a transparent member on an upper part of the image sensor; forming a molding unit to seal the image sensor and the transparent member; and forming a step unit to expose the external connection terminal of the substrate.

The step of installing the transparent member may include the steps of: forming bonding spacers on the transparent member or on a top surface of the image sensor; and fixing the transparent member to the top surface of the image sensor through the bonding spacers.

The step unit is preferably formed through a dicing process to expose an upper end of the external connection terminal.

The manufacturing method of the glass cap molding package may further include a step of: forming a lateral pad on a lateral surface of the substrate to be connected to an external device such as a socket in a side type.

Meanwhile, in accordance with still another aspect of the present invention, there is provided a camera module including a glass cap molding package provided with a substrate with an external connection terminal formed on a peripheral region of a top surface, an image sensor mounted on the top surface of the substrate, a transparent member installed on an upper part of the image sensor, and a molding unit formed to seal the image sensor and the transparent member and exposing the external connection terminal of the substrate to a lateral surface of the substrate; and an auto-focusing device installed on an upper part of the glass cap molding package and having a contact terminal electrically connected to the external connection terminal of the substrate.

The auto-focusing device may include a housing installed on the upper part of the glass cap molding package; a lens barrel installed in the housing and mounting a lens; an actuator for driving the lens barrel upward and downward; and an actuator substrate electrically connecting the actuator to the substrate and having the contact terminal electrically connected to the external connection terminal of the substrate.

The external connection terminal and the contact terminal are soldered to each other by a method such as soldering.

And, in accordance with still another aspect of the present invention, there is provided a camera module including a glass cap molding package provided with a substrate with an external connection terminal formed on a peripheral region of a top surface, an image sensor mounted on the top surface of the substrate, a transparent member installed on an upper part of the image sensor, and a molding unit formed to seal the image sensor and the transparent member and having a step unit to expose the external connection terminal of the substrate; and an auto-focusing device installed on an upper part of the glass cap molding package and having a contact terminal electrically connected to the external connection terminal of the substrate.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Hereinafter, preferable embodiments for a glass cap molding package, a manufacturing method thereof and a camera module in accordance with the present invention will be described in detail with reference to the accompanying drawings.

First Embodiment For a Glass Cap Molding Package

Figure 2:
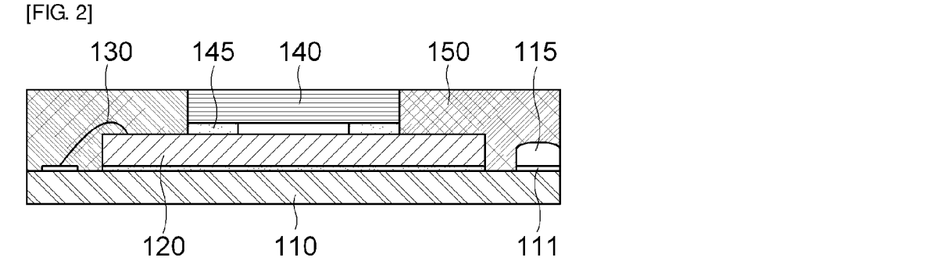
FIG. 2 is a schematic cross-sectional view showing a glass cap molding package in accordance with one embodiment of the present invention.

First of all, FIG. 2 is a schematic cross-sectional view showing a glass cap molding package in accordance with one embodiment of the present invention and a glass cap molding package and a manufacturing method thereof in accordance with one embodiment of the present invention will be described in detail with reference to FIG. 2.

As shown in FIG. 2, in accordance with the one embodiment of the present invention, the glass cap molding package includes a substrate 110 with an external connection terminal 115 formed on a peripheral region of a top surface, an image sensor 120 mounted on a top surface of the substrate 110, a transparent member 140 installed on an upper part of the image sensor 120, and a molding unit 150 formed to seal the image sensor 120 and the transparent member 140 and exposing the external connection terminal 115 of the substrate 110 to a lateral surface of the substrate 110.

Herein, passive elements and various electronic components other than the external connection terminal 115 may be mounted on the top surface of the substrate 110.

And, the external connection terminal 115 may be made of conductive material, for example, a solder terminal made of solder paste or a post terminal made of conductive adhesive or the like.

Meanwhile, the image sensor 120 may be electrically connected to the substrate 110 through a wire 130 by a bonding method.

And, the transparent member 140 is installed on a region corresponding to a light receiving part of the image sensor 120 and may be installed on a top surface of the image sensor 120 through bonding spacers 145.

Meanwhile, the external connection terminal 115 may be formed by dicing the molding unit 150 and the substrate 110 at once.

First Embodiment For a Manufacturing Method of a Glass Cap Molding Package

Then, FIG. 3 to FIG. 8 are cross-sectional views sequentially illustrating a manufacturing method of the glass cap molding package in accordance with the one embodiment of the present invention and the manufacturing method of the glass cap molding package in accordance with the one embodiment of the present invention will be described in detail with reference to FIG. 3 to FIG. 8.

Figure 3:
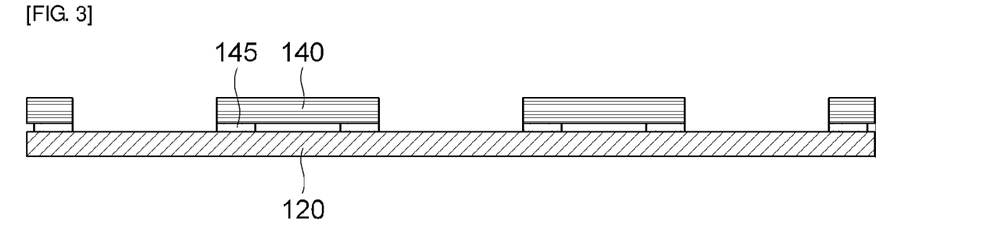
FIG. 3 to FIG. 8 are cross-sectional views sequentially illustrating a manufacturing method of the glass cap molding package in accordance with the one embodiment of the present invention.

First of all, as shown in FIG. 3, a wafer level image sensor 120 is prepared and transparent members 140 are installed on regions corresponding to light receiving parts of the image sensor 120.

At this time, the transparent members 140 may be installed on a top surface of the image sensor 120 through bonding spacers 145.

Figure 4:
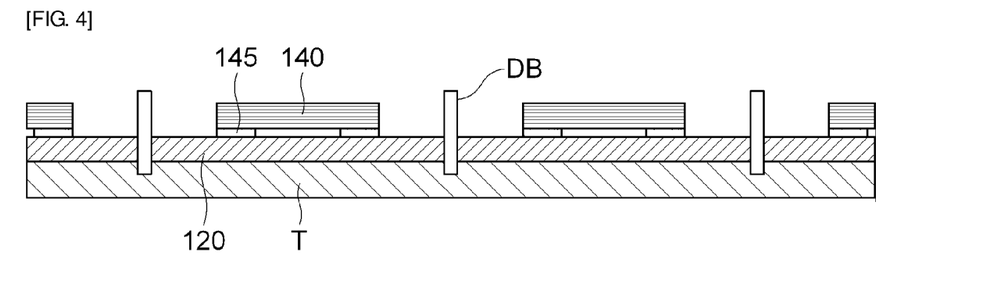

Then, as shown in FIG. 4, the wafer level image sensor 120 are diced through dicing blades DB and divided into a plurality of unit image sensors 120.

At this time, a dicing tape T for a smooth dicing process may be adhered onto a bottom surface of the wafer level image sensor 120.

Figure 5:
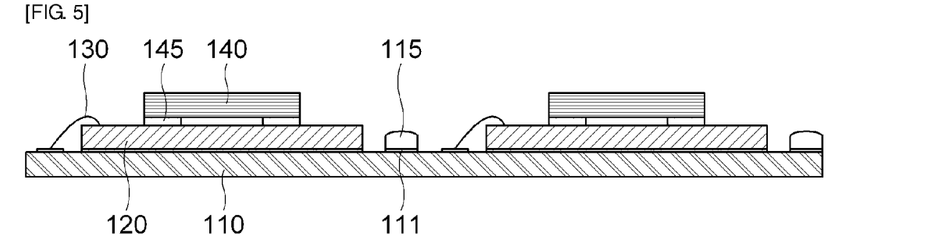

Then, as shown in FIG. 5, the image sensor 120 is mounted on a top surface of a substrate 110 in an array state through a wire 120 by a bonding method.

In addition, components such as passive elements are mounted on the top surface of the substrate 110 by SMT (Surface Mount Technology) and further an external connection terminal 115 is formed on an electrode pad 111 formed on one side of a peripheral region of a top surface of the substrate 110.

At this time, the external connection terminal 115 may be formed by forming a solder terminal by printing solder paste on the one side of the peripheral region of the top surface of the substrate 110 during surface-mounting of the substrate 110 and then curing the solder paste through a reflow process or the like.

Further, the external connection terminal 115 may be formed by forming a post terminal by forming conductive adhesive on the one side of the peripheral region of the top surface of the substrate 110 during the surface-mounting of the substrate 110 and then curing the conductive adhesive through a reflow process or the like.

Figure 6:
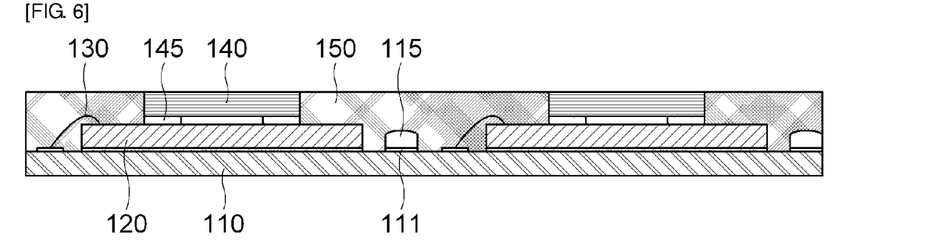

Then, as shown in FIG. 6, a molding unit 150 is formed to seal the image sensor 120, the transparent member 140 and the external connection terminal 115.

At this time, the molding unit 150 may be made of epoxy based resin material.

Figure 7:
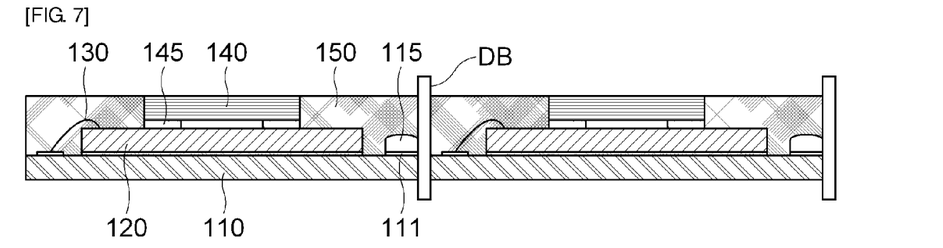

Then, as shown in FIG. 7, the substrate 110 in the array state and molding unit 150 are diced along a dicing line through the dicing blades DB and divided into a plurality of unit glass cap molding packages.

Figure 8:
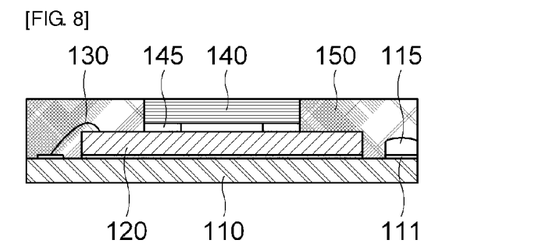

That is, it is possible to divide the substrate 110 in the array state and the molding unit 150 into the unit glass cap molding packages with exposing the external connection terminal 115 to a lateral surface of the substrate 110 as shown in FIG. 8 by dicing the substrate and the molding unit through one dicing process.

Second Embodiment For a Glass Cap Molding Package

A glass cap molding package in accordance with embodiments of the present invention will be described in detail with reference to FIG. 9 to FIG. 11.

Figure 9:
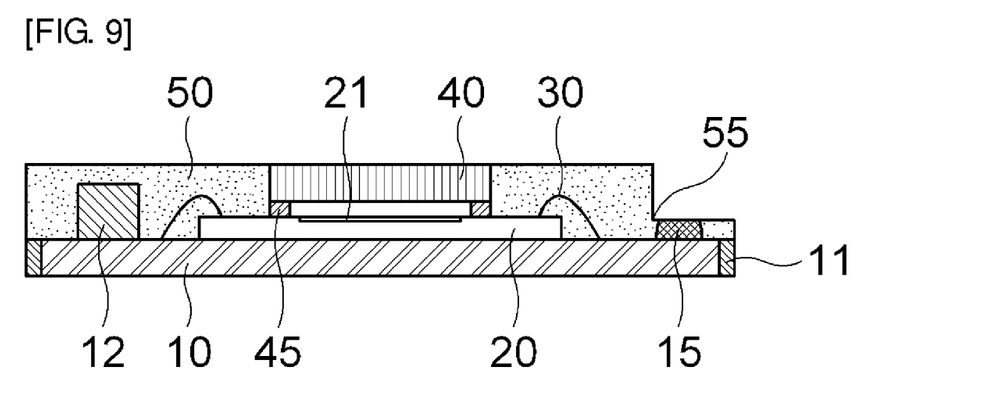
FIG. 9 is a schematic cross-sectional view showing a glass cap molding package in accordance with another embodiment of the present invention.
Figure 10:
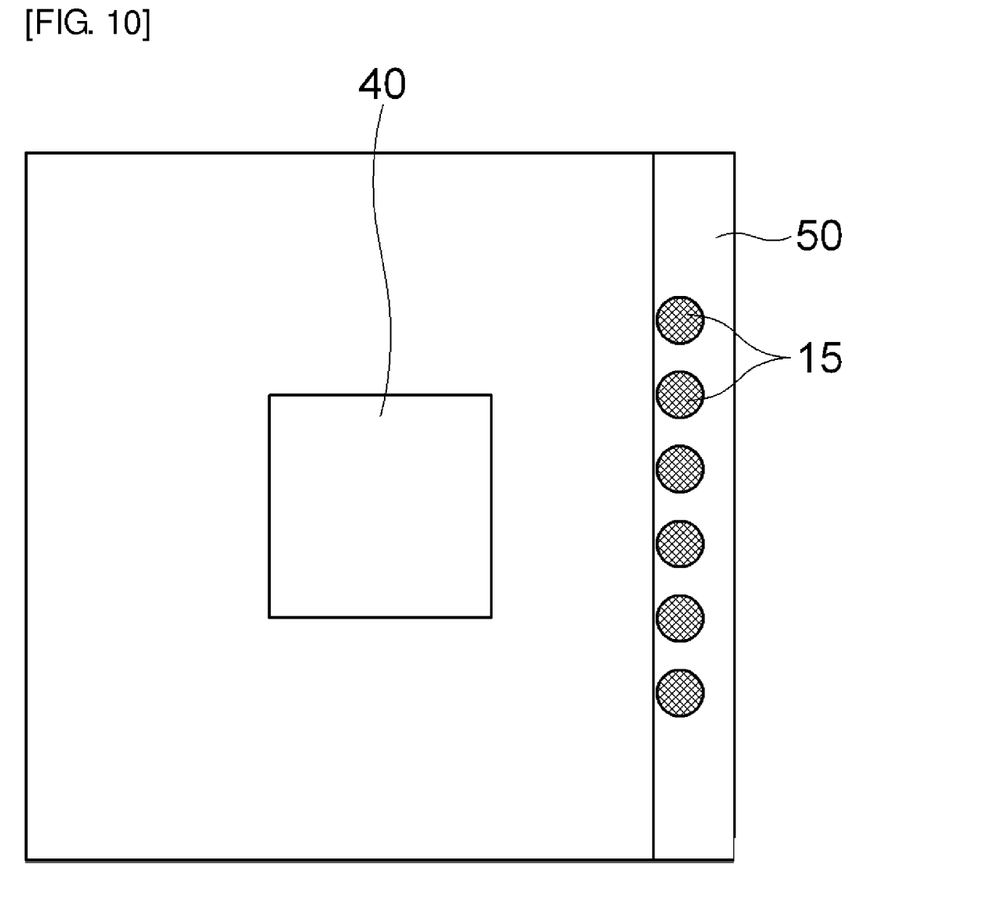
FIG. 10 is a plane-view of FIG. 9.
Figure 11:
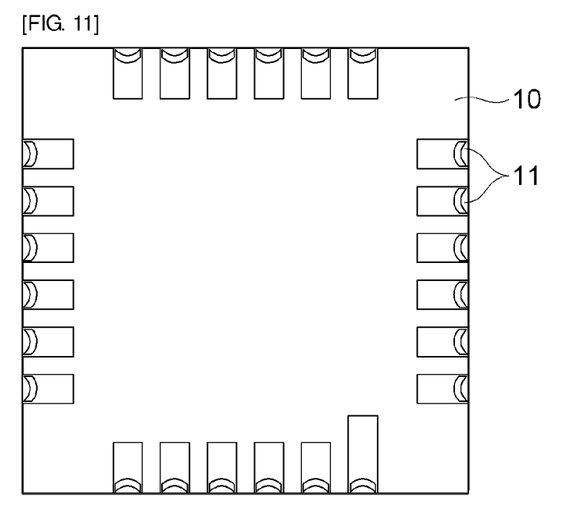
FIG. 11 is a bottom view of FIG. 9.

FIG. 9 is a schematic cross-sectional view showing a glass cap molding package in accordance with the present invention, FIG. 10 is a plane-view of FIG. 9, and FIG. 11 is a bottom view of FIG. 9.

As shown in FIG. 9 to FIG. 11, in accordance with the another embodiment of the present invention, the glass cap molding package includes a substrate 10 with an external connection terminal 15 formed on a peripheral region of a top surface, an image sensor 20 mounted on a top surface of the substrate 10, a transparent member 40 installed on an upper part of the image sensor 20, and a molding unit 50 formed to seal the image sensor 20 and the transparent member 40 and having a step unit 55 to expose the external connection terminal 15 of the substrate 10.

Herein, a passive element and various electronic components other than the external connection terminal 15 may be mounted on the top surface of the substrate 10.

And, the external connection terminal 15 may be made of conductive material, for example, a solder terminal made of solder paste or a post terminal made of conductive adhesive, and so on.

Meanwhile, the image sensor 20 may be electrically connected to the substrate 10 through wires 30 by a bonding method.

And, the transparent member 40 is installed on a region corresponding to a light receiving part 21 of the image sensor 20 and may be installed on a top surface of the image sensor 20 through bonding spacers 45.

Meanwhile, the step unit 55 of the molding unit 50 is formed to expose an upper end of the external connection terminal 15. At this time, the step unit 55 of the molding unit 50 may be formed by dicing the molding unit 50.

And, a later pad 11 may be formed on a lateral surface of the substrate 10 to be connected to an external device such as a socket in a side type.

Second Embodiment For a Manufacturing Method of a Glass Cap Molding Package

Then, a manufacturing method of a glass cap molding package in accordance with embodiments of the present invention will be described in detail with reference to FIG. 12 to FIG. 17.

FIG. 12 to FIG. 17 are cross-sectional views sequentially illustrating a manufacturing method of a glass cap molding package in accordance with the another embodiment of the present invention.

Figure 12:
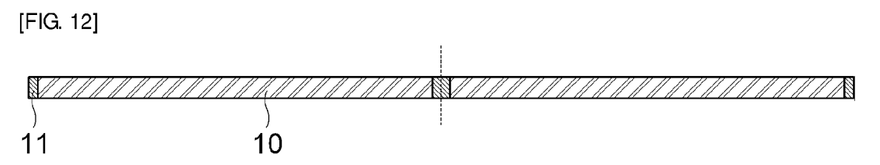
FIG. 12 to FIG. 17 are cross-sectional views sequentially illustrating a manufacturing method of the glass cap molding package in accordance with the another embodiment of the present invention.

First of all, as shown in FIG. 12, a lateral pad 11 is formed on a lateral surface of a substrate 10 to be connected to an external device such as a socket in a side type.

At this time, the lateral pad 11 may be formed, for example, by forming a hole at the substrate 10 and plating the hole with conductive material.

Figure 13:
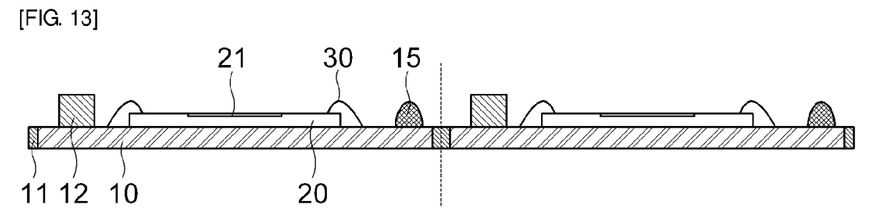

Then, as shown in FIG. 13, an image sensor 20 is mounted on a center of a top surface of the substrate 10 through wires 30 by a bonding method.

In addition, components such as a passive element 12 are mounted on the top surface of the substrate 10 by SMT (Surface Mount Technology) and further an external connection terminal 15 is formed on one side of a peripheral region of a top surface of the substrate 10.

At this time, the external connection terminal 15 may be formed by forming a solder terminal by printing solder paste on the one side of the peripheral region of the top surface of the substrate 10 during surface-mounting of the substrate 10 and then curing the solder paste through a reflow process or the like.

Further, the external connection terminal 15 may be formed by forming a post terminal by forming conductive adhesive on the one side of the peripheral region of the top surface of the substrate 10 during the surface-mounting of the substrate 10 and then curing the conductive adhesive through a reflow process or the like.

Figure 14:
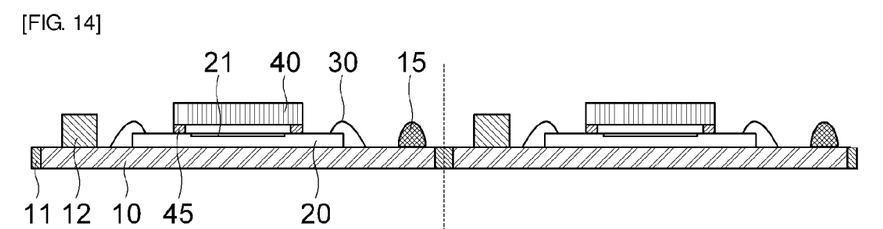

Then, as shown in FIG. 14, a transparent member 40 is installed on a top surface of the image sensor 20.

At this time, the transparent member 40 is adhered and fixed to the top surface of the image sensor 20 through bonding spacers 45 which may be formed on the transparent member 40 or the top surface of the image sensor 20.

Figure 15:
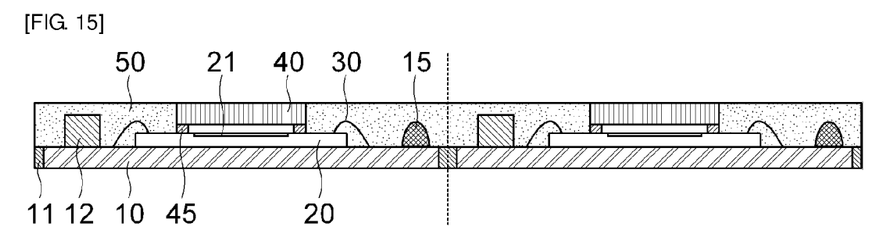

Then, as shown in FIG. 15, a molding unit 50 is formed to seal the image sensor 20 and the transparent member 40.

At this time, the molding unit 50 may be made of epoxy based resin material.

Figure 16:
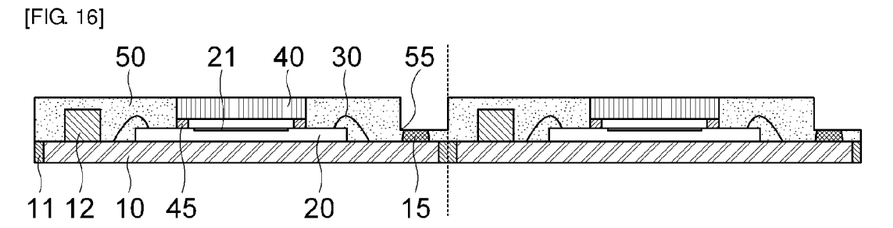

Then, as shown in FIG. 16, a step unit 55 is formed to expose the external connection terminal 15 of the substrate 10.

At this time, the step unit 55 is formed by dicing the molding unit 50 of an external connection terminal 15 side and therefore an upper end of the external connection terminal 15 is exposed upward.

Figure 17:
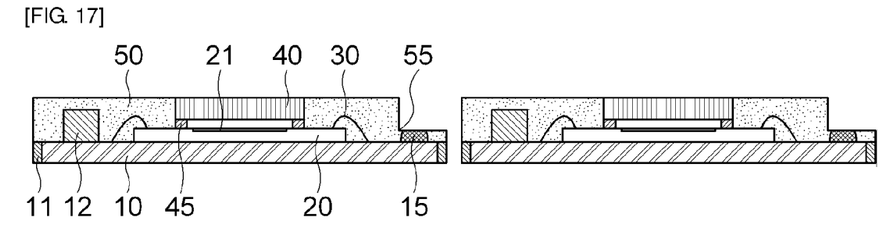

Then, as shown in FIG. 17, the substrate 10 in an array state is diced along a dicing line to be divided into a plurality of unit glass cap molding packages.

Other Embodiments For a Glass Cap Molding Package

Meanwhile, the following other embodiments than the above-mentioned embodiment for a glass cap molding package may be realized.

That is, the external connection terminal in the above-mentioned embodiment for the glass cap molding package may be formed in other types.

Figure 18:
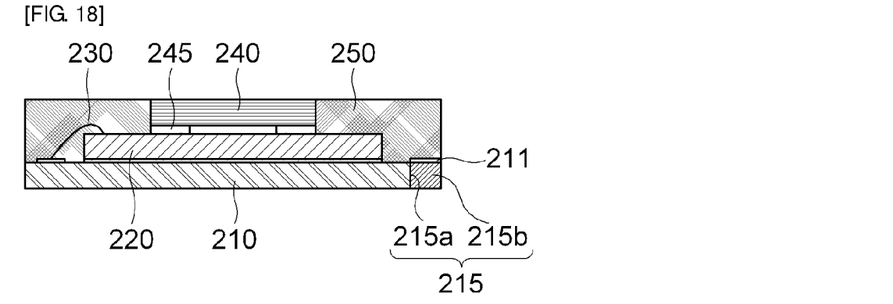
FIG. 18 is a schematic cross-sectional view showing a glass cap molding package in accordance with still another embodiment of the present invention.
Figure 19:
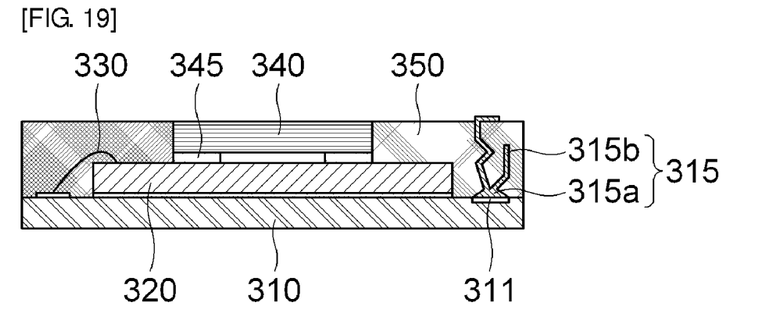
FIG. 19 is a schematic cross-sectional view showing a glass cap molding package in accordance with still another embodiment of the present invention.

FIG. 18 is a schematic cross-sectional view showing a glass cap molding package in accordance with still another embodiment of the present invention and FIG. 19 is a schematic cross-sectional view showing a glass cap molding package in accordance with still another embodiment of the present invention.

First of all, FIG. 18 shows an example of the glass cap molding package using a conductive via 215 in stead of the solder terminal or the post terminal as the external connection terminal.

That is, a via hole 215a corresponding to an electrode pad 211 formed on a top surface of a substrate 210 is formed and the via hole 215a is plated and after forming a molding unit 250, a lateral terminal as the exposed plated region is used as an external connection terminal by exposing a plated region to the via hole 215a in dicing.

Then, FIG. 19 shows an example of the glass cap molding package using a soldered metal spring 315b in stead of the solder terminal or the post terminal as the external connection terminal.

That is, the metal spring 315b is soldered on an electrode pad 311 formed on a top surface of a substrate 310 through solder paste 315a and when forming a molding unit 350, the metal spring 315b is formed to be exposed to an upper part and the exposed metal spring 315b is used as the external connection terminal.

First Embodiment For a Camera Module Having an Auto-focusing Function

Figure 20:
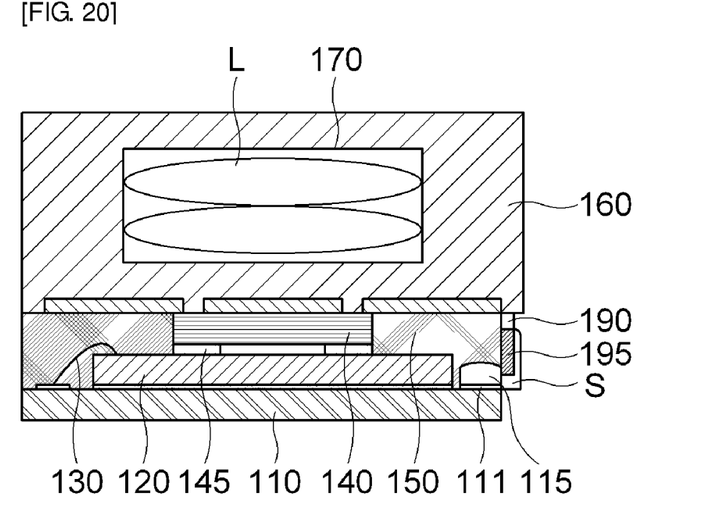
FIG. 20 is a schematic cross-sectional view showing a camera module in accordance with one embodiment of the present invention.

Then, FIG. 20 is a schematic cross-sectional view showing a camera module in accordance with one embodiment of the present invention and the camera module adopting the glass cap molding package and having an auto-focusing function in accordance with the one embodiment of the present will be described in detail with reference to FIG. 20.

As shown in FIG. 20, in accordance with the one embodiment of the present invention, the camera module adopting the glass cap molding package and having the auto-focusing function largely includes a glass cap molding package with the external connection terminal 115 exposed to the lateral surface through one dicing process and an auto-focusing device installed on an upper part of the glass cap molding package and having a contact terminal 95 electrically connected to the external connection terminal 115.

Herein, the auto-focusing device may include a housing 160 installed on the upper part of the glass cap molding package, a lens barrel 170 installed in the housing 160 and mounting lenses L; an actuator(not shown) for driving the lens barrel upward and downward; and an actuator substrate 190 for electrically connecting the actuator to the substrate 110 of the glass cap molding package.

And, a contact terminal 195 is formed on a lower end of the actuator substrate 190 and electrically connected to the external connection terminal 115 exposed to the lateral surface of the substrate 110 of the glass cap molding package.

At this time, the external connection terminal 115 and the contact terminal 195 are preferably soldered to each other by a soldering S method or the like.

Therefore, since the camera module adopting the glass cap molding package in accordance with the embodiment of the present invention has the external connection terminal 115 exposed to the lateral surface of the substrate 110 having an existing size without increasing the size of the substrate 110, it is possible to electrically connect the contact terminal 95 formed on the lower end of the actuator substrate 190 to the external connection terminal 115 by soldering them without necessity to extend the actuator substrate 190 over an periphery of the glass cap molding package in a horizontal direction.

In the result, when the glass cap molding package in accordance with the embodiment of the present invention is applied to the camera module having the auto-focusing function, it is possible to achieve electric connection without increasing the size of the camera module.

Second Embodiment For a Camera Module Having an Auto-Focusing Function

Then, a camera module adopting the glass cap molding package and having an auto-focusing function in accordance with embodiments of the present will be described in detail with reference to FIG. 21.

Figure 21:
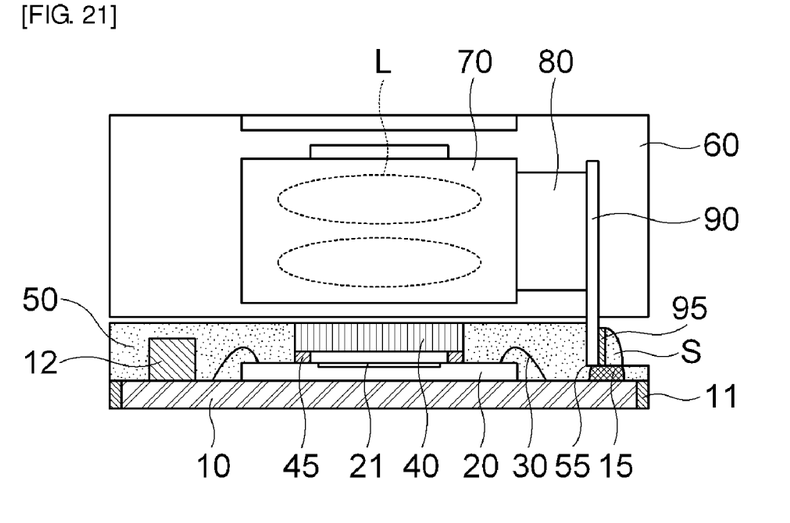
FIG. 21 is a schematic cross-sectional view showing a camera module in accordance with another embodiment of the present invention.

FIG. 21 is a schematic cross-sectional view showing a camera module in accordance with a second embodiment of the present invention.

As shown in FIG. 21, in accordance with the second embodiment of the present invention, the camera module adopting the glass cap molding package and having the auto-focusing function largely includes the glass cap molding package with the external connection terminal 15 exposed upward by the step unit 55 and an auto-focusing device installed on an upper part of the glass cap molding package and having a contact terminal 95 electrically connected to the external connection terminal 15.

Herein, the auto-focusing device may include a housing 60 installed on the upper part of the glass cap molding package, a lens barrel 70 installed in the housing 60 and mounting lenses L; an actuator (80) for driving the lens barrel upward and downward; and an actuator substrate 90 for electrically connecting the actuator 80 to the substrate 10 of the glass cap molding package.

And, a contact terminal 95 is formed on a lower end of the actuator substrate 90 and electrically connected to the external connection terminal 15 exposed upward on the substrate 10 of the glass cap molding package.

At this time, the external connection terminal 15 and the contact terminal 95 are preferably soldered to each other by a soldering S method or the like.

Therefore, since the camera module adopting the glass cap molding package in accordance with the second embodiment of the present invention has the external connection terminal 15 exposed upward on the substrate 10 with an existing size 110 without increasing the size of the substrate 10, it is possible to electrically connect the contact terminal 95 formed on the lower end of the actuator substrate 90 to the external connection terminal 15 by soldering without necessity to extend the actuator substrate 90 over an periphery of the glass cap molding package in a horizontal direction.

In the result, when the glass cap molding package in accordance with the second embodiment of the present invention is applied to the camera module having the auto-focusing function, it is possible to realize electric connection without increasing the size of the camera module.

Further, in accordance with the second embodiment of the present invention, the camera module adopting the glass cap molding package has an advantage of implementing standardization of a camera module according to socket application by forming the lateral pad 11 for connection of a side connection type socket on a lateral surface of the substrate 10, because the external connection terminal 15 exposed upward is formed on the substrate 10 with the existing size without increasing the size of the substrate 10.

As described above, in accordance with the preferable embodiments of the present invention, the glass cap molding package and the camera module having the same have advantages of reducing a manufacturing cost and improving productivity by manufacturing a small module in comparison with the conventional module and simplifying the process by exposing the external connection terminal through one dicing process.

Further, the glass cap molding package and the camera module having the same have an advantage of implementing standardization of the camera module by applying the side connection type socket.

As described above, although a few preferable embodiments of the present invention have been shown and described, it will be appreciated by those skilled in the art that substitutions, modifications and changes may be made in these embodiments without departing from the principles and spirit of the general inventive concept, the scope of which is defined in the appended claims and their equivalents.

What is claimed is:
1. A camera module comprising:
a glass cap molding package including a substrate with an external connection terminal formed on a peripheral region of a top surface, an image sensor mounted on the top surface of the substrate, a transparent member installed on an upper part of the image sensor, and a molding unit formed to seal the image sensor and the transparent member and exposing the external connection terminal of the substrate to a lateral surface of the substrate; and an auto-focusing device installed on an upper part of the glass cap molding package and including a contact terminal electrically connected to the external connection terminal of the substrate.

2. The camera module according to claim 1, wherein the auto-focusing device includes:

a housing installed on the upper part of the glass cap molding package;

a lens barrel installed in the housing and mounting a lens;

an actuator for driving the lens barrel upward and downward; and an actuator substrate electrically connecting the actuator to the substrate and provided with the contact terminal electrically connected to the external connection terminal of the substrate.

3. The camera module according to claim 1, wherein the external connection terminal and the contact terminal are soldered to each other by a method such as soldering.

* * * * *